(12) United States Patent
Hillman, Jr.

(10) Patent No.: US 8,731,857 B2
(45) Date of Patent: May 20, 2014

(54) METHOD AND APPARATUS FOR GENERATING A GATED DENSITY BITMAP

(75) Inventor: Alfred K. Hillman, Jr., Banks, OR (US)

(73) Assignee: Tektronix, Inc., Beaverton, OR (US)

( * ) Notice: Subject to any disclaimer, the term of this patent is extended or adjusted under 35 U.S.C. 154(b) by 591 days.

(21) Appl. No.: 12/826,506

(22) Filed: Jun. 29, 2010

(65) Prior Publication Data

US 2011/0320148 A1    Dec. 29, 2011

(51) Int. Cl.
*G01R 23/16* (2006.01)

(52) U.S. Cl.
USPC .......................................................... 702/77

(58) Field of Classification Search
USPC .......................................................... 702/77
See application file for complete search history.

(56) References Cited

U.S. PATENT DOCUMENTS

| | | | |
|---|---|---|---|
| 5,545,976 A | 8/1996 | Cutler | |
| 6,208,946 B1 | 3/2001 | Arakawa et al. | |
| 8,185,330 B2 * | 5/2012 | Lye et al. | 702/60 |
| 2004/0028003 A1 | 2/2004 | Diener et al. | |
| 2008/0082278 A1 | 4/2008 | Tan et al. | |
| 2008/0306703 A1 | 12/2008 | Lye et al. | |
| 2009/0179630 A1 | 7/2009 | Wright et al. | |
| 2009/0290793 A1 * | 11/2009 | Engholm et al. | 382/171 |

FOREIGN PATENT DOCUMENTS

| | | |
|---|---|---|
| EP | 1111396 A2 | 6/2001 |
| EP | 1884876 A2 | 2/2008 |

OTHER PUBLICATIONS

Agilent Product Note "Time-Gated Spectrum Analysis: New Measurement Fundamentals", Agilent PN 8590-2, Printed in U.S.A. 7/00, 5952-3685, available at http://cp.literature.agilent.com/litweb/pdf/5952-3685.pdf.
"Agilent 89600 Vector Signal Analysis Software Technical Overview", Printed in USA, Apr. 14, 2010, 5989-1679EN, available at http://cp.literature.agilent.com/litweb/pdf/5989-1679EN.pdf.
"Agilent X-Series Signal Analyzer Spectrum Analyzer Mode User's and Programmer's Reference", manual part No. N9060-90027, printed in USA Mar. 2010, available at http://cp.literature.agilent.com/litweb/pdf/N9060-90027.pdf.
European Search Report from EP No. 11165724.3, dated May 29, 2013, 6 pages.

* cited by examiner

*Primary Examiner* — Aditya Bhat
(74) *Attorney, Agent, or Firm* — Michael A. Nelson; Marger, Johnson & McCollom, P.C.

(57) ABSTRACT

A test and measurement instrument converts digital data that represents an input signal into a series of frequency spectra and accumulates frequency spectra into a bitmap database in response to a gating signal. In some embodiments, the gating signal is generated when the instantaneous power of the input signal violates a power threshold.

17 Claims, 7 Drawing Sheets

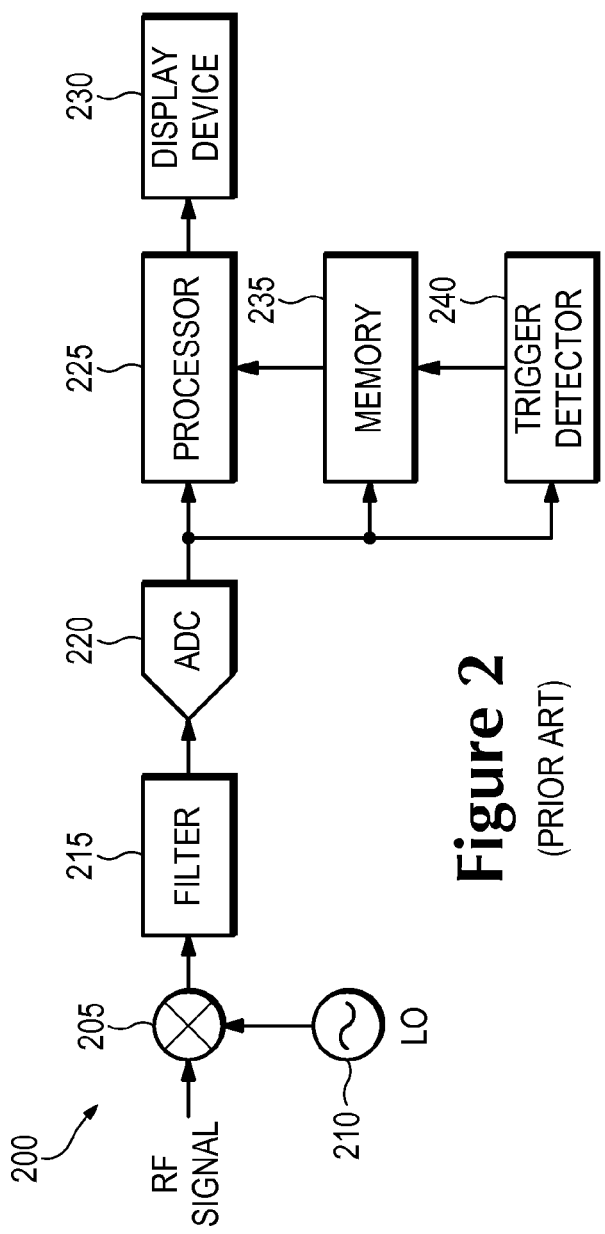
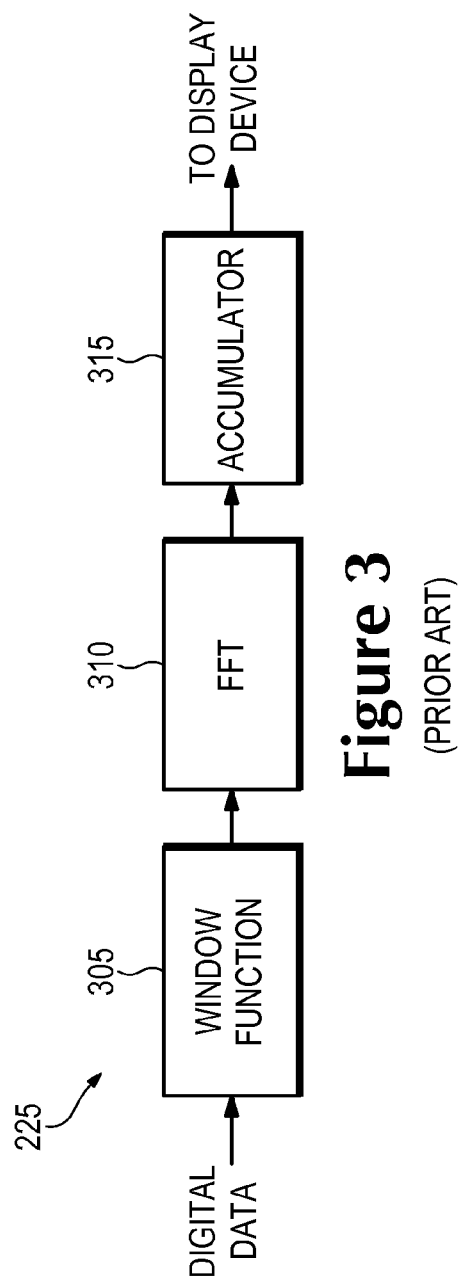

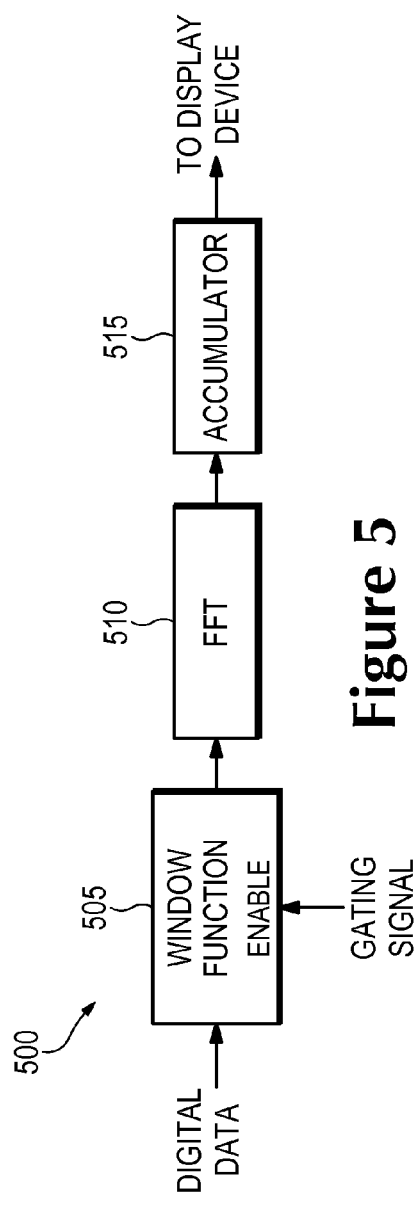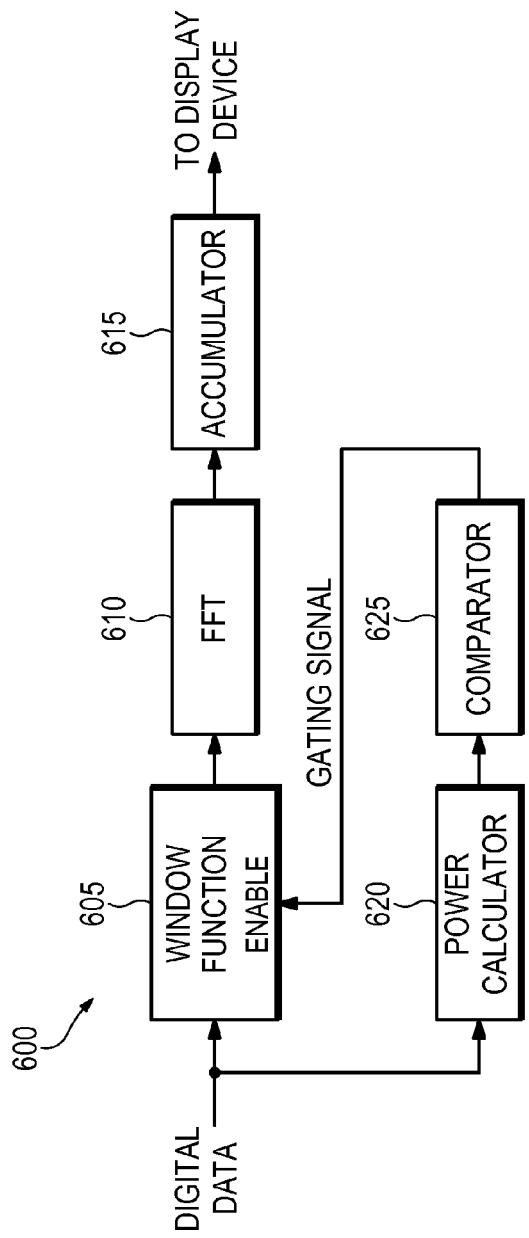

METHOD AND APPARATUS FOR GENERATING A GATED DENSITY BITMAP

FIELD OF THE INVENTION

The present invention relates to test and measurement instruments, and more particularly to density bitmaps.

BACKGROUND OF THE INVENTION

Real-time spectrum analyzers such as the RSA6100 and RSA3400 families available from Tektronix, Inc. of Beaverton, Oreg. trigger on, capture, and analyze RF signals in real-time. These test and measurement instruments seamlessly capture RF signals so that, unlike conventional swept spectrum analyzers and vector signal analyzers, no data is missed within a specified bandwidth.

Tektronix real-time spectrum analyzers use a technology referred to as "Digital Phosphor" or alternatively as "DPX®" to produce a display referred to as a "DPX spectrum." A DPX spectrum is formed by digitizing an input signal to produce a continuous stream of digital data and then processing the digital data in real-time by transforming it into a series of frequency spectra and then accumulating the frequency spectra in a database. The database provides a precise measurement of the percentage of time during the measurement period that the input signal occupied particular locations in the amplitude or power versus frequency space, also referred to as "DPX Density®". DPX acquisition and display technology reveals signal details such as short-duration or infrequent events that are completely missed by conventional spectrum analyzers and vector signal analyzers. For more information on DPX, see Tektronix document number 37W-19638 titled "DPX® Acquisition Technology for Spectrum Analyzers Fundamentals" available at http://www.tek.com/.

SUMMARY OF THE INVENTION

In some instances, a user may want to observe the DPX spectrum of a pulsed RF signal. Unfortunately, the DPX spectrum will sometimes appear as shown in FIG. 1 where the pulsed RF signal 105 is obscured by phantom traces 110 and noise floor traces 115. The noise floor traces 115 correspond to times when no RF pulse was present. The phantom traces 110 are a consequence of the fact that the RF pulses are not synchronized with the DPX processing, and thus, occasionally a frequency spectrum is produced based on a segment of digital data that represents a rising or falling edge of an RF pulse. When such a discontinuous time-domain waveform is transformed into the frequency domain, it gives the appearance that the input signal contains energy in neighboring frequency bins. This effect is referred to as "spectral spreading" or alternatively "spectral leakage." Real-time spectrum analyzers use time windowing to mitigate spectral spreading, however even time windowing cannot prevent spectral spreading in all cases.

The inventor of the present invention has recognized that, in order to avoid spectral spreading, what is needed is a real-time spectrum analyzer that is capable of accumulating frequency spectra into a database only when an RF pulse is fully on. Accordingly, embodiments of the present invention provide a test and measurement instrument that converts digital data that represents an input signal into a series of frequency spectra and accumulates frequency spectra into a bitmap database in response to a gating signal. In some embodiments, the gating signal is generated when the instantaneous power of the input signal violates a power threshold.

The objects, advantages, and other novel features of the present invention are apparent from the following detailed description when read in conjunction with the appended claims and attached drawings.

BRIEF DESCRIPTION OF THE DRAWINGS

FIG. 2 depicts a high-level block diagram of a conventional real-time spectrum analyzer.

FIG. 3 illustrates how digital data is processed to produce a conventional bitmap database.

FIG. 5 illustrates how digital data is processed to produce a bitmap database according to a first embodiment of the present invention.

FIG. 6 illustrates how digital data is processed to produce a bitmap database according to a second embodiment of the present invention.

DETAILED DESCRIPTION OF THE INVENTION

Figure 1:
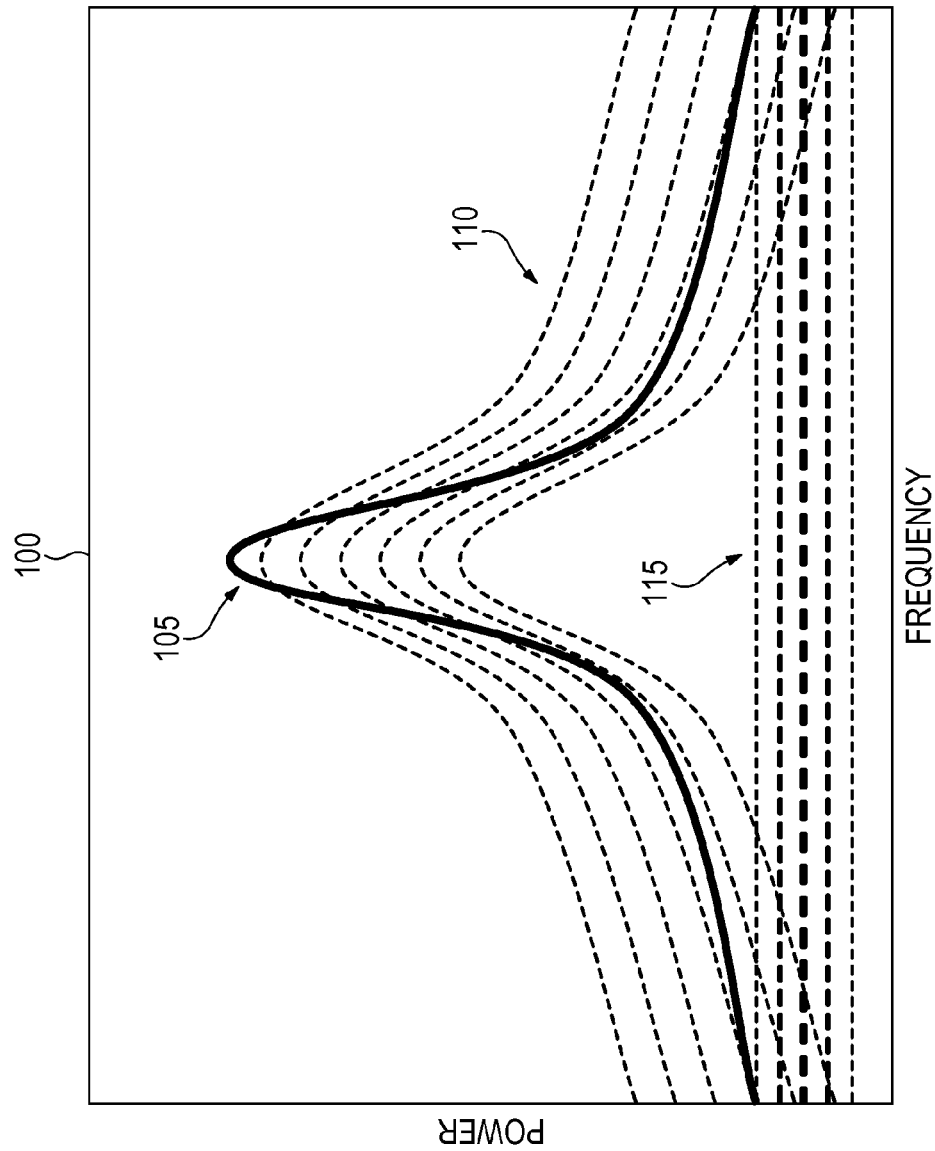
FIG. 1 depicts a conventional DPX spectrum display.

Referring now to FIG. 2, a real-time spectrum analyzer 200 receives a radio frequency (RF) input signal and optionally down-converts it using a mixer 205, local oscillator (LO) 210, and filter 215 to produce an intermediate frequency (IF) signal. An analog-to-digital converter (ADC) 220 digitizes the IF signal to produce a continuous stream of digital data that represents the IF signal. The digital data is processed in two paths. In the first path, the digital data is input to a processor 225 that analyzes the digital data in real-time. In the second path, the digital data is input to a memory 235 (which, in some embodiments, comprises a circular buffer) and also input to a trigger detector 240 that processes the digital data in real-time and compares the processed data to a user-specified trigger criterion. When the processed digital data satisfies the trigger criterion, the trigger detector 240 generates a trigger signal that causes the memory 235 to store a block of digital data. The processor 225 then analyzes the stored digital data in non-real time. After processing by processor 225, the digital data may be displayed on the display device 230 or stored in a storage device (not shown).

Figure 4:
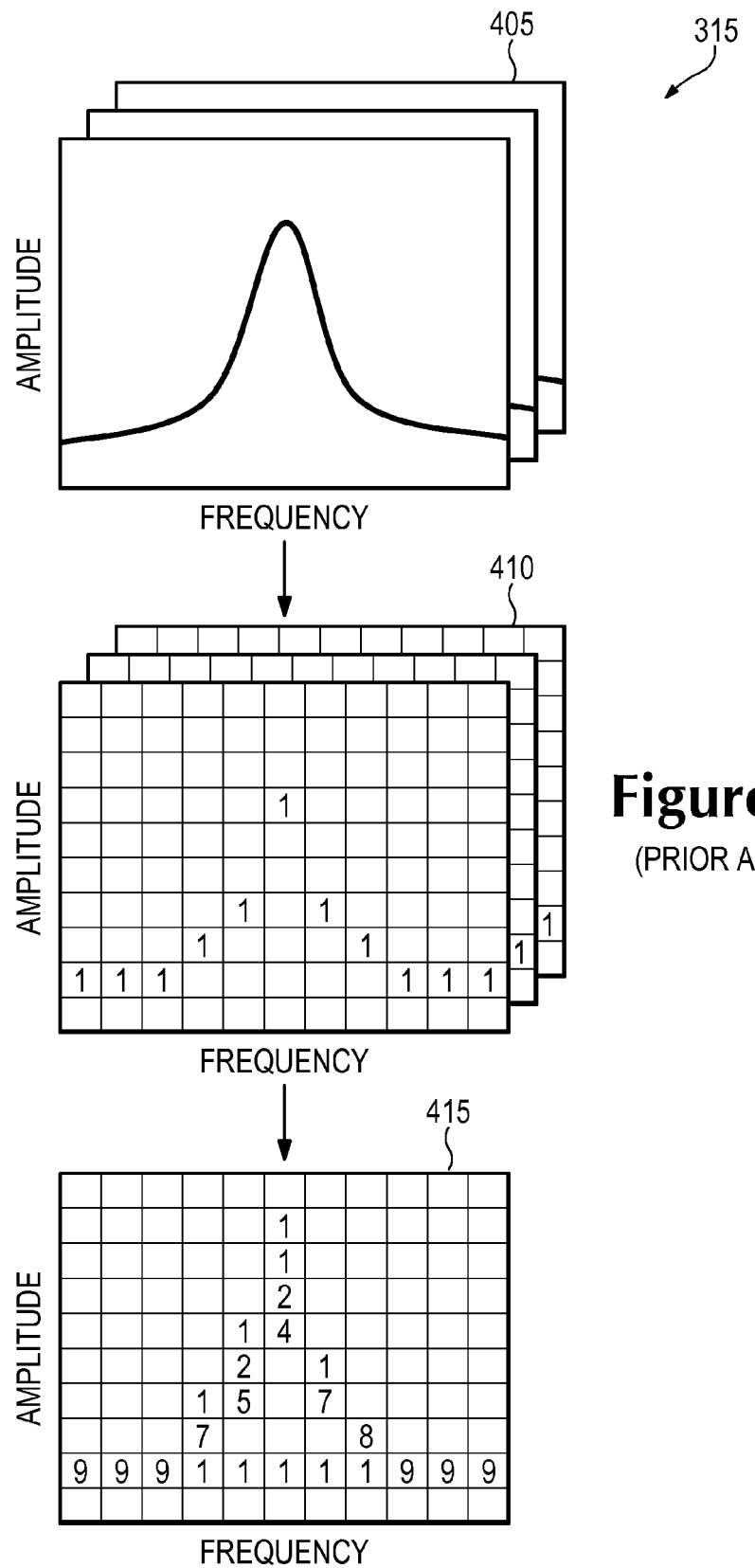
FIG. 4 illustrates how frequency spectra are accumulated in a bitmap database.

Referring now to FIG. 3, in order to provide DPX processing, the processor 225 processes the continuous stream of digital data in real-time by time windowing time segments of the digital data using a window function 305 to produce a series of time windowed time segments, transforming the series of time windowed time segments into a series of frequency spectra using a frequency transform 310 such as a fast Fourier transform (FFT), a chirp-Z transform, or the like, and then accumulating the frequency spectra in a data structure referred to as a "bitmap database" using an accumulator 315. The accumulator 315 may accumulate the frequency spectra in various ways. In one embodiment shown in FIG. 4, each frequency spectrum 405 is rasterized to produce a "rasterized spectrum" 410. A rasterized spectrum comprises an array of cells arranged in of a series of rows and columns, with each row representing a particular amplitude or power value and each column representing a particular frequency value. The value of each cell is either a "1," also referred to as a "hit," which indicates that the input signal was present at that particular location in the amplitude or power versus frequency space during the measurement period, or a "0" (depicted as a blank cell), which indicates that it was not. The values of the corresponding cells of the rasterized spectra 410 are summed together to form the bitmap database 415, and then the value of each cell of the bitmap database 415 is divided by the total number of rasterized spectra 410 so that it indicates the total number of hits during the measurement period divided by the total number of rasterized spectra 410, or equivalently, the percentage of time during the measurement period that the input signal occupied that particular location in the amplitude or power versus frequency space, also referred to as "DPX Density®" or alternatively "density." The rasterized spectra 405 and the bitmap database 415 are depicted as having ten rows and eleven columns for simplicity, however it will be appreciated that in an actual embodiment, the rasterized spectra 410 and the bitmap database 415 may have hundreds of rows and columns. The bitmap database 415 is essentially a three-dimensional histogram, with the x-axis being frequency, the y-axis being amplitude or power, and the z-axis being density. The bitmap database 415 may be displayed on the display device 230 with the density of each cell being represented by a color-graded pixel. Alternatively, the bitmap database 415 may be stored in a storage device (not shown).

In some embodiments of the present invention, the accumulator only accumulates frequency spectra into a bitmap database when a gating signal is asserted (i.e., when the gating signal indicates a logical one). This functionality may be implemented in various ways. For example, as shown in FIG. 5 the gating signal may be applied to an enable input of the window function 505 so that the window function 505 only passes time windowed time segments to the frequency transform 510, and thus the frequency transform 510 only passes frequency spectra to the accumulator 515 when the gating signal is asserted. When the gating signal is not asserted (i.e., when the gating signal indicates a logical zero), the window function 505 does not pass time windowed time segments to the frequency transform 510, and thus the frequency transform 510 does not pass frequency spectra to the accumulator 515. It will be appreciated that the gating signal may alternatively be applied to an enable input of the frequency transform 510 or the accumulator 515 to produce an equivalent result.

In some embodiments, the gating signal is generated externally and input to the real-time spectrum analyzer 200. For example, the gating signal may be generated by another test and measurement instrument. In other embodiments, the gating signal is generated within the real-time spectrum analyzer 200.

Figure 7:
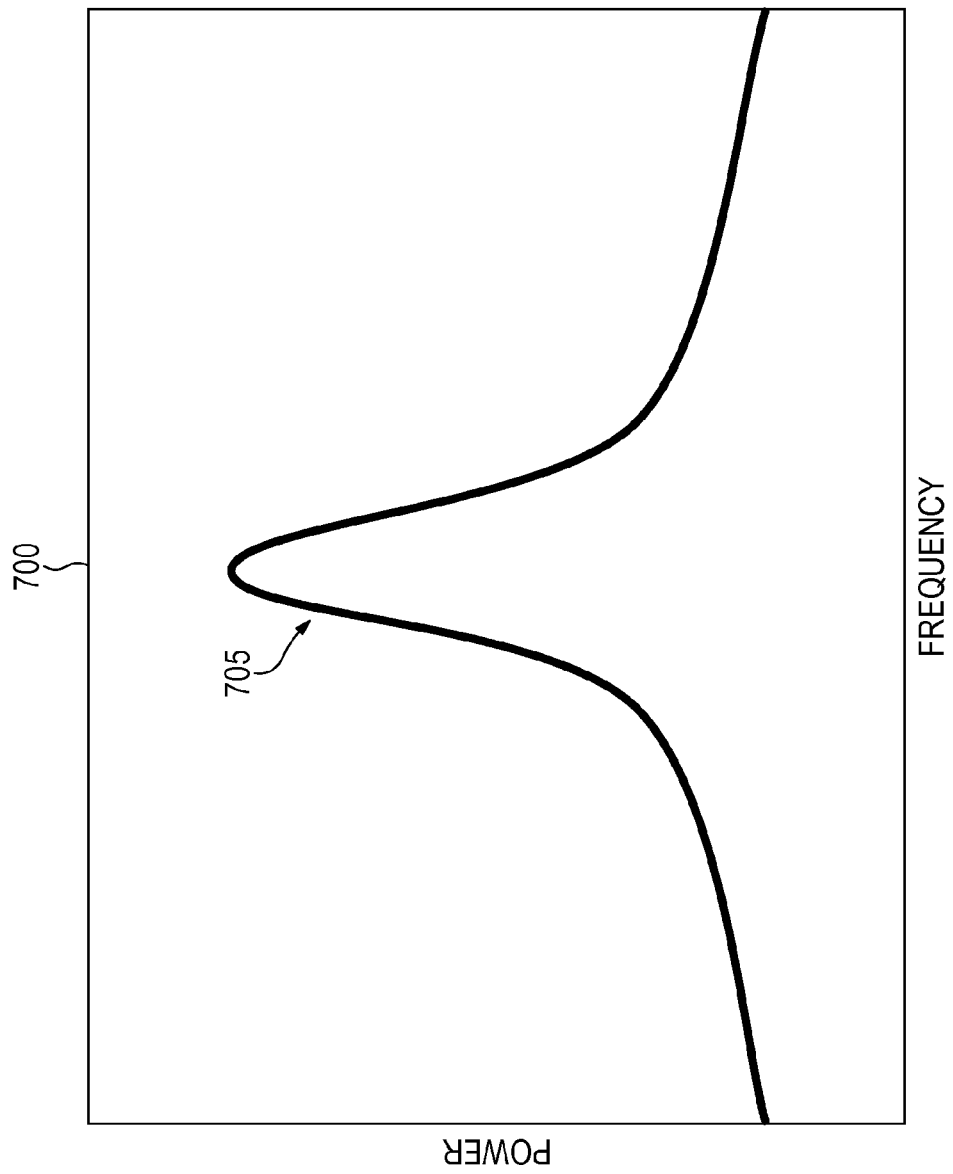
FIG. 7 depicts a DPX spectrum display produced according to an embodiment of the present invention.

In some embodiments, the processor 225 generates the gating signal when the instantaneous power of the signal under test violates a user-specified power threshold. This functionality may be implemented in various ways. One example is shown in FIG. 6 where a power calculator 620 calculates the instantaneous power of the digital data, and a comparator 625 compares the calculated instantaneous power to a user-specified power threshold and generates the gating signal when the calculated instantaneous power violates the user-specified power threshold. "Violate" means either "exceeds" or "is lower than" depending on a user-specified selection. The embodiment shown in FIG. 6 is particularly useful for measuring RF pulses. For example, if the user sets the power threshold just below the peak value of the RF pulses and specifies that "violates" means "exceeds," then the gating signal will only be generated, and thus the accumulator 615 will only accumulate frequency spectra when the instantaneous power of the RF pulses is above that value, that is, when the RF pulses are fully on. That is, the accumulator 615 will not accumulate any frequency spectra during times when the RF pulses are turning on, are turning off, or are not present at all, and thus the resulting DPX spectrum will not suffer from spectral spreading as shown in FIG. 7. The lack of spectral spreading makes it much easier for the user to identify intermittent anomalies and other abnormal behavior that occurs while RF pulses 705 are present.

Figure 8:
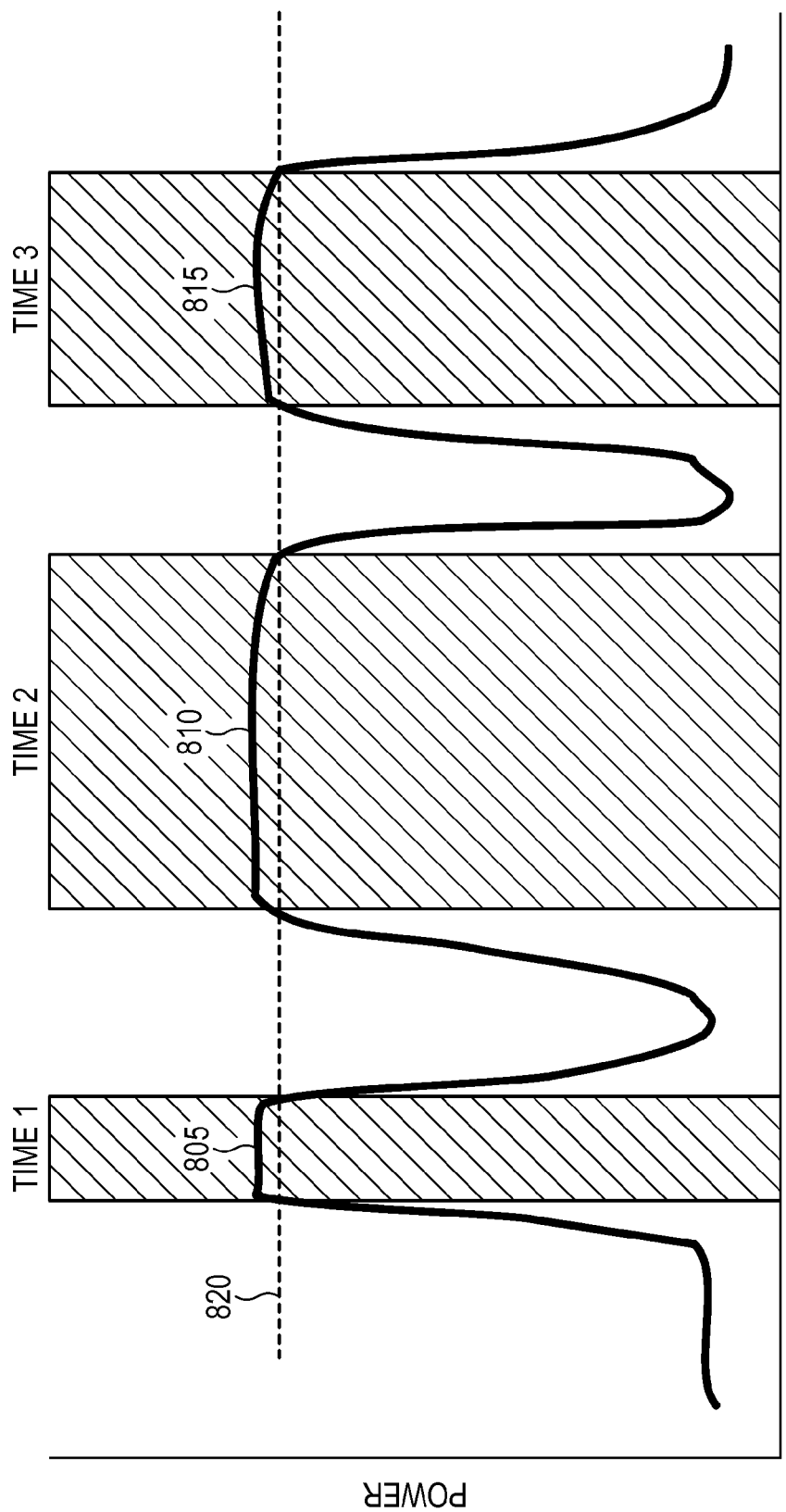
FIG. 8 illustrates how the embodiment shown in FIG. 6 generates a gating signal correctly even when the input signal consists of a series of RF pulses having different pulse widths.

Importantly, the embodiment shown in FIG. 6 generates the gating signal correctly even when the input signal consists of a series of RF pulses having different pulse widths. For example, consider the case shown in FIG. 8 in which the input signal consists of RF pulses 805, 810, and 815, each of which has a different pulse width. If the power threshold 820 is set just below the peak value of those RF pulses, then the gating signal will be generated, and thus the accumulator 615 will accumulate frequency spectra, during TIME 1, TIME 2, and TIME 3 which correspond to the times when RF pulses 805, 810, and 815 are fully on. It will be appreciated that no conventional spectrum analyzer is capable of acquiring data in this manner.

In alternative embodiments, the accumulator only accumulates frequency spectra into the bitmap database when the gating signal is not asserted. This embodiment is also particularly useful for measuring RF pulses. For example, if the user sets the power threshold just above the off-power of the RF pulses and specifies that "violate" means "exceeds," then the accumulator will only accumulate frequency spectra when the instantaneous power of the input signal is below that level, that is, when the RF pulses are fully off. In this manner, the user may observe the input signal only when the RF pulses are not present.

Figure 9:
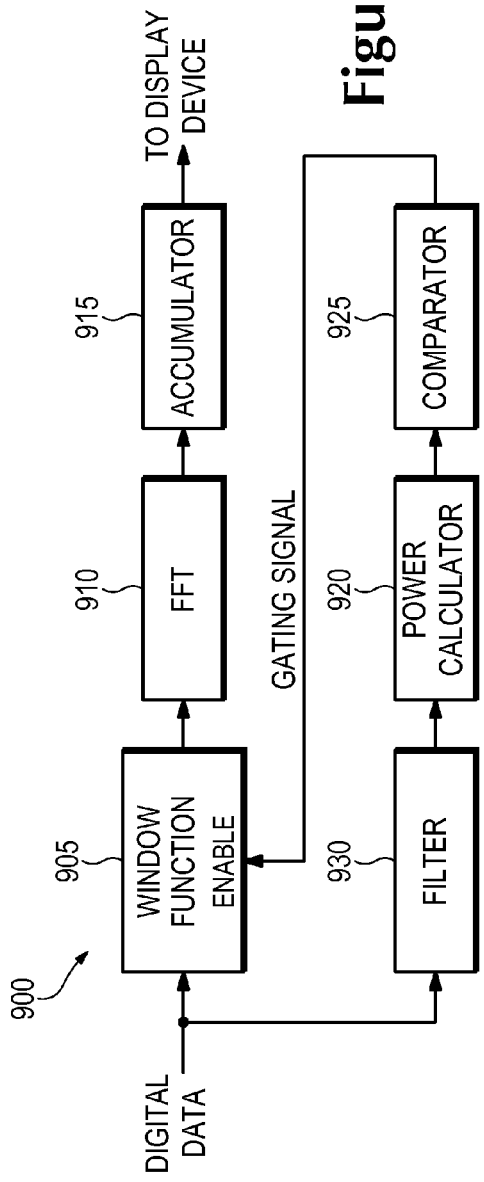
FIG. 9 illustrates how digital data is processed to produce a bitmap database according to a third embodiment of the present invention.

Referring now to FIG. 9, in some embodiments the digital data that is input to the power calculator 920 is first filtered with a filter 930 having user-specified characteristics. In this manner, the gating signal is generated when the instantaneous power of the input signal within a user-specified frequency band violates the user-specified power threshold. The filter may be any kind of filter including low-pass, high-pass, band-pass, band-reject, and so on. The filter 930 may be implemented in various ways. In some embodiments, the filter 930 is implemented as a discrete-time filter such as a Finite Impulse Response (FIR) filter. In other embodiments, the filter 930 filters the digital data by transforming it into a frequency spectrum, multiplying the frequency spectrum by a filter function, transforming the modified spectrum back into the time-domain, and then passing the resulting waveform as the filtered digital data. In an alternative embodiment, the filter 930 transforms the digital data into a frequency spectrum and then passes that frequency spectrum as the filtered digital data. In that case, the power calculator 920 calculates the frequency domain power in each frequency bin of the frequency spectrum, and the comparator 925 generates the gating signal when the frequency domain power of one or more of the frequency bins violates the user-specified power threshold. It will be appreciated that numerous other implementations will achieve substantially similar functionality without departing from the spirit and scope of the invention.

Figure 10:
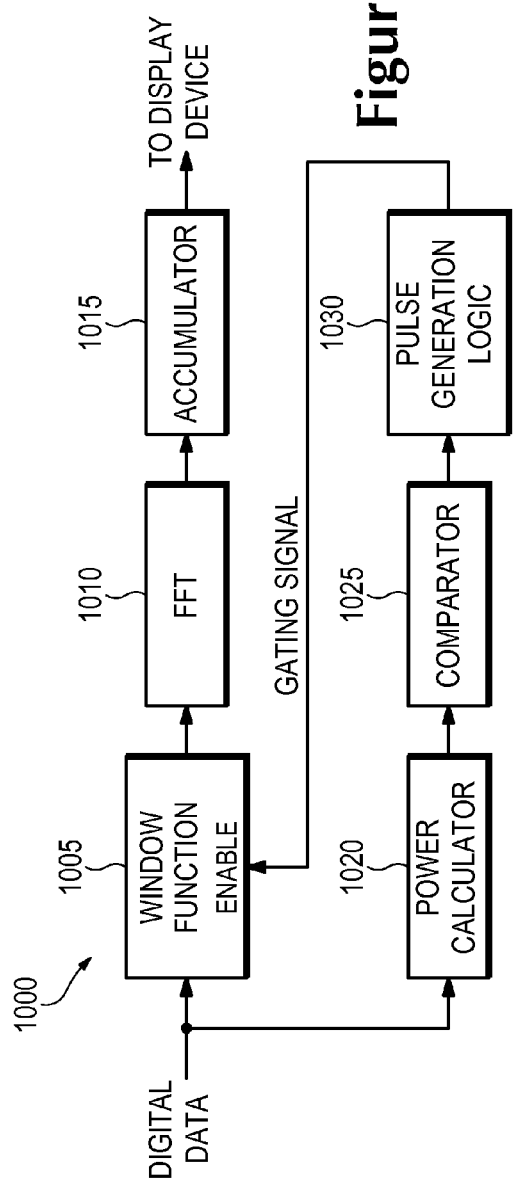
FIG. 10 illustrates how digital data is processed to produce a bitmap database according to a fourth embodiment of the present invention.

In some embodiments, the timing of the gating signal may be adjusted by the user. This functionality may be implemented in various ways. One example is shown in FIG. 10 where the output of the comparator 1025 is input to pulse generation logic 1030 before it is input to the accumulator 1015. When the comparator 1025 produces an edge, the pulse generation logic 1030 generates a pulse that causes the accumulator 1015 to accumulate frequency spectra while the pulse is asserted. In some embodiments, the width of the pulse is user-specified. In other embodiments, the pulse generation logic 1030 produces the pulse after a user-specified delay. In some embodiments, the pulse generation logic 1030 produces the pulse in response to the rising edge of the output of the comparator 1025. In other embodiments, the pulse generation logic 1030 produces the pulse in response to the falling edge of the output of the comparator 1025. With these various user-specifiable parameters, a user may observe various aspects of a pulsed RF signal. For example, the user may observe a window of time that is 10 microseconds long after the rising edge of each RF pulse, regardless of the actual width of the RF pulse. For another example, the user may observe a window of time that is 100 microseconds long beginning 5 microseconds after the falling edge of each RF pulse. It will be appreciated that pulse generation logic may also be used when the gating signal is generated externally and input to the real-time spectrum analyzer 200.

In some embodiments, the processor 225 automatically determines the peak power of the RF pulses in the input signal and sets the power threshold based on that value. The processor 225 can determine the peak power of the RF pulses by detecting the maximum value of the calculated instantaneous power.

It will be appreciated that various modifications may be made to the embodiments described herein in order to achieve different performance characteristics without departing from the spirit and scope of the invention. For example, in some embodiments, the continuous stream of digital data is converted into a continuous series of time segments by grouping every N consecutive digital data values into a different time segment, where N is an integer, regardless of the state of the gating signal. For example, the continuous stream of digital data may be converted into a continuous series of time segments by grouping every 1024 consecutive digital data values into a different time segment, regardless of the state of the gating signal. In other embodiments, a new series of time segments is started each time the gating signal is asserted, thereby synchronizing the time segments to the input signal. For example, after the gating signal is asserted, the first 1024 digital data values make up the first time segment, the second 1024 digital data values make up the second time segment, and so on. In some embodiments, the accumulator only accumulates a frequency spectrum if the gating signal is asserted when the corresponding time segment starts and if it is still asserted when the corresponding time segment ends. In other embodiments, the accumulator accumulates frequency spectra if the gating signal is asserted at any time during the corresponding time segment. In some embodiments, the digital data that is input to the window function is delayed by a delay element (not shown) in order to compensate for the insertion delay of other circuitry such as the filter, the power calculator, the comparator, and so on.

In various embodiments, the processor 225 may be implemented in hardware, software, or a combination of the two, and may comprise and/or be executed on a general purpose microprocessor, a digital signal processor (DSP), an application specific integrated circuit (ASIC), a field-programmable gate array (FPGA), or the like.

Various parameters described herein are described as "user-specified." It will be appreciated, however, that in various other embodiments those parameters may be determined automatically by the processor 225 or defined by a standard.

It will be appreciated from the foregoing discussion that the present invention represents a significant advance in the field of test and measurement equipment. Although specific embodiments of the invention have been illustrated and described for purposes of illustration, it will be understood that various modifications may be made without departing from the spirit and scope of the invention. Accordingly, the invention should not be limited except as by the appended claims.

What is claimed is:

1. A test and measurement instrument comprising:
   an analog-to-digital converter for converting an input signal into a continuous stream of digital data; and
   a processor for processing the digital data in real-time by:
      windowing time segments of the digital data to produce a series of time windowed time segments,
      transforming the series of time windowed time segments into a series of frequency spectra using a frequency transform, and
      accumulating frequency spectra in a database in response to a gating signal that indicates a radio frequency signal is above a controllable power threshold.

2. A test and measurement instrument as in claim 1 wherein the processor accumulates frequency spectra in the database when the gating signal is asserted.

3. A test and measurement instrument as in claim 1 wherein the processor accumulates frequency spectra in the database when the gating signal is not asserted.

4. A test and measurement instrument as in claim 1 wherein the gating signal is generated externally to the test and measurement instrument.

5. A test and measurement instrument as in claim 4 wherein the timing of the gating signal is adjustable.

6. A test and measurement instrument as in claim 1 wherein the gating signal is generated within the test and measurement instrument.

7. A test and measurement instrument as in claim 6 wherein the processor generates the gating signal when the instantaneous power of the input signal violates a power threshold.

8. A test and measurement instrument as in claim 7 wherein the processor generates the gating signal when the instantaneous power of the input signal within a frequency band violates the power threshold.

9. A test and measurement instrument as in claim 7 wherein the processor automatically determines the power threshold based on the digital data.

10. A test and measurement instrument as in claim 6 wherein the timing of the gating signal is adjustable.

11. A method comprising the steps of:
    converting an input signal into a continuous stream of digital data; and
    processing the digital data in real-time by:
       windowing time segments of the digital data to produce a series of time windowed time segments,
       transforming the series of time windowed time segments into a series of frequency spectra, and
       accumulating frequency spectra in a database in response to a gating signal that indicates a radio frequency signal is above a controllable power threshold.

12. A method as in claim 11 wherein the frequency spectra are accumulated in the database when the gating signal is asserted.

13. A method as in claim 11 wherein the frequency spectra are accumulated in the database when the gating signal is not asserted.

14. A method as in claim 11 wherein the gating signal is generated when the instantaneous power of the input signal violates a power threshold.

15. A method as in claim 14 wherein the gating signal is generated when the instantaneous power of the input signal within a frequency band violates the power threshold.

16. A method as in claim 14 wherein the power threshold is determined automatically based on the digital data.

17. A method as in claim 14 wherein the timing of the gating signal is adjustable.

* * * * *